United States Patent
Puaud et al.

(10) Patent No.: US 12,274,110 B2
(45) Date of Patent: Apr. 8, 2025

(54) SIMPLIFIED STRUCTURE OF TWO-TERMINAL TANDEM SOLAR CELLS WITH TRANSPARENT CONDUCTING OXIDE JUNCTION MATERIAL

(71) Applicants: COMMISSARIAT À L'ÉNERGIE ATOMIQUE ET AUX ÉNERGIES ALTERNATIVES, Paris (FR); 3SUN S.R.L., Catania (IT)

(72) Inventors: Apolline Puaud, Grenoble (FR); Muriel Matheron, Grenoble (FR); Maria-Delfina Munoz, Grenoble (FR)

(73) Assignees: COMMISSARIAT À L'ÉNERGIE ATOMIQUE ET AUX ÉNERGIES ALTERNATIVES, Paris (FR); 3SUN S.R.L., Catania (IT)

( * ) Notice: Subject to any disclaimer, the term of this patent is extended or adjusted under 35 U.S.C. 154(b) by 0 days.

(21) Appl. No.: 18/257,812

(22) PCT Filed: Dec. 13, 2021

(86) PCT No.: PCT/FR2021/052295
§ 371 (c)(1),
(2) Date: Jun. 15, 2023

(87) PCT Pub. No.: WO2022/129757
PCT Pub. Date: Jun. 23, 2022

(65) Prior Publication Data
US 2024/0107785 A1      Mar. 28, 2024

(30) Foreign Application Priority Data
Dec. 18, 2020   (FR) ........................... 2013592

(51) Int. Cl.
*H10K 39/15*       (2023.01)
*H10K 85/50*       (2023.01)

(52) U.S. Cl.
CPC ............. *H10K 39/15* (2023.02); *H10K 85/50* (2023.02)

(58) Field of Classification Search
CPC ........ H10K 30/10; H10K 30/57; H10K 39/15; H10K 85/50; H01L 31/0725; H01L 31/0747
See application file for complete search history.

(56) References Cited

U.S. PATENT DOCUMENTS

| 10,622,409 B2 | 4/2020 | Kamino et al. |
| 2018/0174761 A1 | 6/2018 | kamino et al. |

(Continued)

FOREIGN PATENT DOCUMENTS

| CN | 107369767 A | 11/2017 |
| CN | 209016100 U | 6/2019 |

(Continued)

OTHER PUBLICATIONS

International Search Report for PCT/FR2021/052295 dated Apr. 4, 2022.

(Continued)

*Primary Examiner* — Golam Mowla
(74) *Attorney, Agent, or Firm* — Chrisman Gallo Tochtrop LLC

(57) ABSTRACT

A tandem photovoltaic structure including, from the rear face to the front face: a first SHJ solar cell comprising a first layer of P-type doped amorphous silicon and a substrate of N-type doped crystalline silicon, a junction layer, a second perovskite-type solar cell comprising an active layer and a second P-type layer, the junction layer being made of N-type TCO and being in direct contact either with the second P-type layer or with the first P-type layer, one amongst the first or second solar cell also comprising an N-type layer, the (Continued)

junction layer serving as an N-type layer in the other one amongst the first or second solar cell.

7 Claims, 3 Drawing Sheets

(56) References Cited

U.S. PATENT DOCUMENTS

| | | |
|---|---|---|
| 2018/0175112 A1 | 6/2018 | Robinson et al. |
| 2019/0221690 A1* | 7/2019 | Bush .................. H10K 30/57 |
| 2020/0313093 A1* | 10/2020 | Padture ................ H10K 85/50 |

FOREIGN PATENT DOCUMENTS

| | | | |
|---|---|---|---|
| CN | 111554764 A | 8/2020 | |
| WO | WO 2016/198898 A1 * | 12/2016 | ........... H10K 30/151 |
| WO | WO-2018057419 A1 * | 3/2018 | ........... H01L 27/302 |

OTHER PUBLICATIONS

Written Opinion for PCT/FR2021/052295 dated Apr. 4, 2022.
Shen et al. "In situ recombination junction between p-Si and TiO2 enables high-efficiency monolithic perovskite/Si tandem cells", Science Advances, 2018; 4: eaau9711, pp. 1-12.
Zheng et al. "Large area efficient interface layer free monolithic perovskite/homo-junction-silicon tandem solar cell with over 20% efficiency", Energy Environ. Sci., 2018, 11, 2432-2443.

\* cited by examiner

SIMPLIFIED STRUCTURE OF TWO-TERMINAL TANDEM SOLAR CELLS WITH TRANSPARENT CONDUCTING OXIDE JUNCTION MATERIAL

CROSS-REFERENCE TO RELATED APPLICATIONS

This is a National Stage application of PCT international application PCT/FR2021/052295, filed on Dec. 13, 2021, which claims the priority of French Patent Application No. FR 2013592, filed Dec. 18, 2020, both of which are incorporated herein by reference in their entirety.

TECHNICAL FIELD

The present invention relates to the field of photovoltaic devices, in particular 2-terminal perovskite tandem type photovoltaic cells on a silicon heterojunction.

The invention relates to a simplified structure having (photo)electrical properties comparable to those of a conventional tandem structure.

PRIOR ART

Solar cells allow converting a portion of the spectral domain of solar radiation into energy. To increase the yield of this conversion, it is possible to manufacture structures with a tandem architecture comprising two subsets (i.e. a lower cell and an upper cell), absorbing in different spectral domains.

Many configurations are possible. For example, the lower cell 10 may be a cell made of perovskite, CIGS (Cu(In,Ga)Se$_2$), or it may consist of a silicon-based cell, for example, with a homojunction or with a silicon heterojunction (HET-Si or SHJ standing for "Silicon HeteroJunction solar cell"), of the PERC ("Passivated Emitter and Rear Contact") or TopCon ("Tunnel Oxide Passivated Contact") type or an N-type PERT cell with double diffusion of phosphorus.

For example, the upper cell 30 may be a perovskite, organic or multi-junction cell (MJSC) based on Ill-V materials (AlGaAs, GaInP, GaAs).

The two sub-cells may be stacked on top of each other according to a NIP/NIP (FIG. 1A) or PIN/PIN (FIG. 1B) scheme.

For illustration, in the case of 2-terminal perovskite-type tandem structures on a silicon heterojunction, the NIP-type structure conventionally comprises from the rear face to the front face (FIG. 1A):
- a lower cell 10 comprising a layer of N-doped amorphous silicon 11, a substrate of crystalline silicon 12 disposed between two layers of intrinsic amorphous silicon 13, 14, a layer of P-doped amorphous silicon 15, —a recombination zone 20,
- an upper cell 30 comprising: a N-type layer 33, an active layer 31 made of a perovskite material, a P-type layer 32.

Lower 40 and upper 50 electrodes, as well as electrical contacts 60, 70 complete the structure.

In the case of a PIN-type structure, the P and N type layers are reversed (FIG. 1B).

Each sub-cell 10, 30 of the tandem structure includes layers which allow separating and selecting the charges according to their polarity.

The recombination zone 20 between the two sub-cells is called "recombination junction" because it enables the charges to recombine. In general, it is formed of a layer of transparent conductive oxide or of a tunnel junction (two very doped layers, one of the N type and the other one of the P type). This recombination zone enables the serial connection of the sub-cells and thus the addition of their voltages. It should lead to the recombination of the electrons generated in the upper cell 30 and the holes generated in the lower cell 10 for a NIP structure tandem (FIG. 1A) and the opposite for a PIN structure (FIG. 1B).

However, these tandem structures require many steps to be manufactured, which increases the manufacturing costs and the number of layers and interfaces likely to lower the performances (by adding serial resistance, contact resistances, undesirable recombinations, etc.).

It has been shown that a NIP-like tandem structure comprising a perovskite upper cell and a lower cell based on crystalline silicon and poly-Si could function by directly positioning the upper cell over the lower cell (Shen et al. "*In situ recombination junction between p-Si and TiO$_2$ enables high-efficiency monolithic perovskite/Si tandem cells*", Science Advances, 2018; 4: eaau9711). More particularly, a layer of N-type TiO$_2$ is deposited by ALD directly over the P-doped silicon of the lower cell. Then, a layer of perovskite and a P-type layer made of PTAA are deposited. The operation of this structure is made possible thanks to the low contact resistivity between the ALD layer of TiO$_2$ and the P-doped silicon of the lower cell.

Similarly, a perovskite tandem structure on a silicon heterojunction has been manufactured by directly depositing the layer of N-type SnO$_2$ of the upper cell made of perovskite over the P-type layer of the lower cell (Zheng et al. "Large area efficient interface layer free monolithic perovskite/homo-junction-silicon tandem solar cell with over 20% efficiency", Energy Environ. Sci., 2018, 11, 2432-2443).

However, to date, there is no simplified perovskite tandem structure on a silicon heterojunction based on amorphous silicon and crystalline silicon. Indeed, the amorphous silicon/crystalline silicon heterojunction is very sensitive to the temperature used during the process. In addition, the deposition of the perovskite active layer is generally carried out by liquid means and is therefore greatly dependent on the substrate over which it is deposited as well as the implemented manufacturing steps, which makes a modification of their architecture very difficult to carry out.

DISCLOSURE OF THE INVENTION

The present invention aims to propose a two-terminal perovskite tandem structure on a silicon heterojunction based on amorphous silicon and crystalline silicon having good electrical properties and which is simpler and less expensive to manufacture.

For this purpose, the present invention provides a 2-terminal tandem structure comprising from the rear face to the front face:
- a first solar cell with a silicon heterojunction (based on amorphous silicon and crystalline silicon) comprising a first P-type layer made of doped amorphous silicon and a substrate of n-type doped crystalline silicon, disposed between a first layer of intrinsic amorphous silicon and a second layer of intrinsic amorphous silicon,
- a junction layer,
- a second perovskite-type solar cell comprising an active layer made of a perovskite material and a second P-type layer,
- one amongst the first solar cell or the second solar cell also comprising an N-type layer, the junction layer being made of a transparent conductive oxide, and the junction layer being in contact either with the second layer of intrinsic amorphous silicon of the first solar cell and with the second P-type layer of the second solar cell, or with the first P-type layer made of doped amorphous silicon of the first solar cell and with the active layer of the second solar cell, the junction layer serving as an N-type layer in the other one amongst the first solar cell or the second solar cell.

The invention differs essentially from the prior art by the use of a junction material made of a transparent conductive oxide (TCO standing for "Transparent Conductive Oxides") which serves not only as a recombination junction but also for charge selection (N-type contact) for one of the cells in the tandem structure. Thus, the tandem structure operates, even though one of the two sub-cells is free of a N-type layer; the function of this N-type layer then being ensured by the layer made of transparent conductive oxide itself.

This simplified structure is simpler to manufacture compared to the conventional tandem solar structures. The reduction in the number of steps of the manufacturing process results in a reduction in manufacturing costs.

According to a first variant, the tandem structure is of the NIP type. The second cell is free of the N-type layer. In other words, the second cell is formed by the active layer made of a perovskite material and the second P-type layer. The active layer made of a perovskite material is then in direct contact with the junction layer made of TCO which thus serves as an N-type layer for the NIP-type tandem structure.

According to this first variant, the structure may comprise from the rear face to the front face:

the first solar cell with a silicon heterojunction based on amorphous silicon and crystalline silicon comprising from the rear face to the front face:

a layer of N-doped amorphous silicon, the first layer of intrinsic amorphous silicon, the substrate of crystalline silicon, the second layer of intrinsic amorphous silicon, and the first P-type layer made of doped amorphous silicon, the junction layer made of N-type TCO, the second perovskite-type solar cell comprising from the junction layer to the front face: the active layer made of a perovskite material and the second P-type layer, preferably made of PTAA.

Such an architecture has several advantages: the (p)a-Si:H/TCO interface has good recombination properties and, like the stack of the lower cell, it is homogeneous, the deposition of the perovskite layer over the TCO is also homogeneous.

According to a second variant, the tandem structure is of the PIN type. The first cell is free of a N-type layer: the first cell is formed of the substrate made of crystalline silicon, covered on either side by a layer of intrinsic amorphous silicon, and the P-type layer (the P-type layer is the first layer of the stack starting from the rear face). There is no N-type layer between the substrate made of crystalline silicon and the junction layer made of TCO: the junction layer is in direct contact with the second layer of intrinsic amorphous silicon.

According to this second variant, the structure may comprise from the rear face to the front face:

the first solar cell with a silicon heterojunction based on amorphous silicon and crystalline silicon comprising from the rear face to the front face: the first P-type layer made of doped amorphous silicon, the first layer of intrinsic amorphous silicon, the substrate of crystalline silicon, the second layer of intrinsic amorphous silicon, the junction layer made of N-type TCO, the second perovskite-type solar cell comprising from the junction layer to the front face: a P layer, preferably made of PTAA or TFB, the active layer made of a perovskite material and an N-type layer, preferably made of $SnO_2$ or formed by a $PCBM/SnO_2$ or PCBM/BCP bilayer.

The perovskite-type upper cell herein consists of a conventional cell (i.e. the perovskite layer is deposited over the P-type layer). Such a cell is known and may be made easily with conventional processes.

Advantageously, the junction layer has a thickness from 2 to 30 nm.

Advantageously, the junction layer has a conductivity higher than 10 S·cm$^{-1}$.

According to an advantageous variant, the junction layer is made of ITO.

According to another advantageous variant, the junction layer is made of AZO, ZnO, IWO, IZO, IZrO or $SnO_{2-x}$ with x greater than 0 and strictly less than 2.

Advantageously, the perovskite material has the formula $Cs_xFA_{1-x}Pb(I_{1-y}Br_y)_3$ type (with x<0.20; 0<y<1).

Other features and advantages of the invention will appear from the following complementary description.

It goes without saying that this complementary description is given only for illustration of the object of the invention and should in no way be interpreted as a limitation of this object.

BRIEF DESCRIPTION OF THE DRAWINGS

The present invention will be better understood upon reading the description of embodiments given merely for informative and non-limiting purposes with reference to the appended drawings wherein.

The different portions represented in the figures are not necessarily plotted according to a uniform scale, to make the figures more readable.

In the description hereinafter, terms that depend on the orientation, such as "top"/"upper", "bottom"/"lower", etc. of a structure apply while considering that the tandem device and the test structure are oriented as illustrated in the figures.

DETAILED DISCLOSURE OF PARTICULAR EMBODIMENTS

Figure 1A:
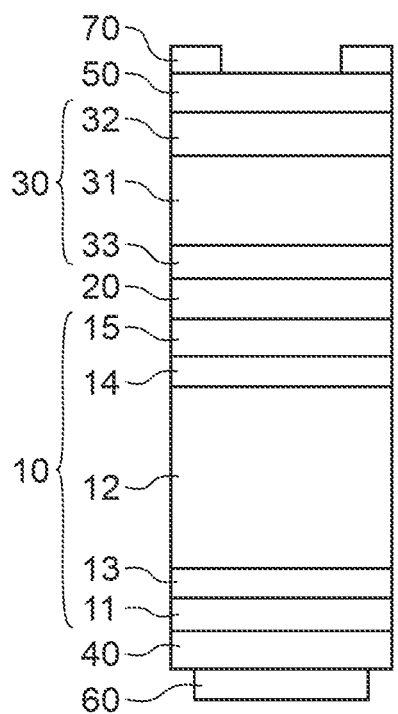
FIG. 1A already discussed in the prior art, represents, schematically and in section, a two-terminal NIP-type tandem structure.
Figure 1B:
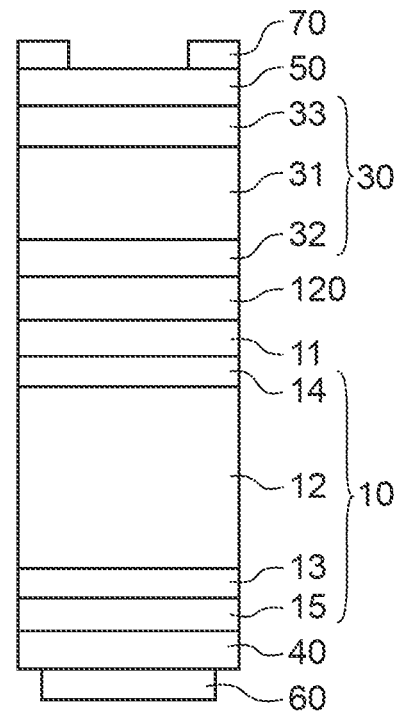
FIG. 1B already discussed in the prior art, represents, schematically and in section, a two-terminal PIN-type tandem structure.
Figure 2A:
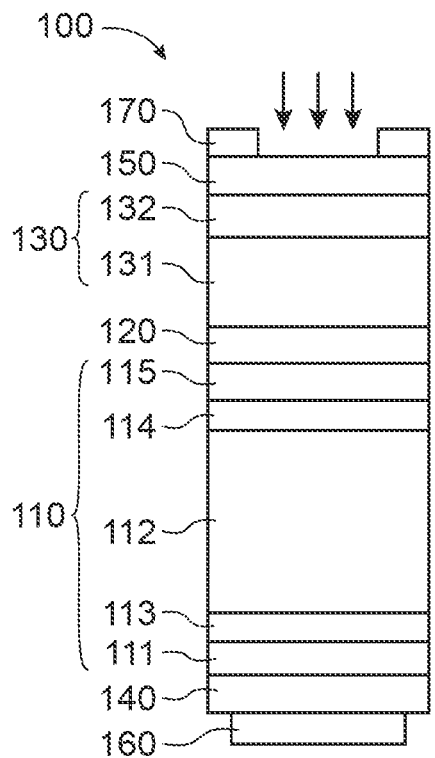
FIG. 2A represents, schematically and in section, a simplified two-terminal NIP-type tandem structure, according to a particular embodiment of the invention.
Figure 2B:
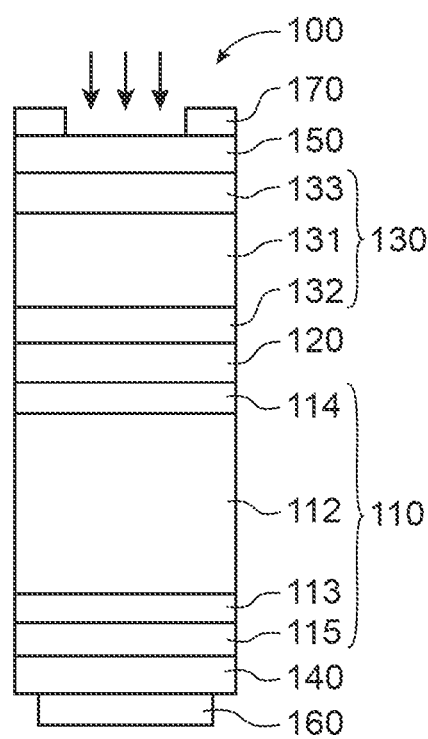
FIG. 2B represents, schematically and in section, a simplified two-terminal PIN-type tandem structure, according to another particular embodiment of the invention.

First of all, reference is made to FIGS. 2A and 2B which represent simplified tandem structures 100.

The tandem structures 100 comprise from the rear face to the front face (i.e. the face intended to receive the light radiation represented by the arrows) a multilayer stack forming:
- a first cell 110 (or lower cell for "bottom cell") with a silicon heterojunction (HET-Si or SHJ standing for "Silicon HeteroJunction solar cell") based on amorphous silicon and crystalline silicon, positioned at the rear face,
- a junction layer 120 made of a transparent conductive oxide (also called junction and recombination layer), intended to electrically contact the two sub-cells of the tandem structure 100 and enabling the charges to recombine,
- a second perovskite-type cell 130 (or upper cell for "top cell") positioned at the front face.

The tandem structure 100 may be a NIP-type (FIG. 2A) or PIN-type (FIG. 2B) structure.

More particularly, the NIP-type (or with a standard emitter) structure comprises from the rear face to the front face (FIG. 2A):
- a first solar cell 110 with a silicon heterojunction; based on amorphous silicon and crystalline silicon; and comprising from the rear face to the front face: a layer of N-doped amorphous silicon (also called layer of n-doped hydrogenated amorphous silicon and also denoted (n) a-Si:H) 111, a substrate of doped crystalline silicon 112 (typically a substrate of n-doped crystalline silicon also denoted c-Si (n)) disposed between two layers of intrinsic amorphous silicon 113, 114 (also called layers of (i) a-Si:H or intrinsic hydrogenated amorphous silicon), and a layer of P-doped amorphous silicon (also denoted (p) a-Si:H for p-doped hydrogenated amorphous silicon) 115,
- a junction layer 120 made of N-type transparent conductive oxide (also known by the acronym TCO),
- a second perovskite-type solar cell 130 comprising, from the junction layer 120 to the front face, an active layer 131 made of a perovskite material and a P-type layer 132, For this NIP-type structure, the active layer 131 of the second cell 130 is directly in contact with the junction layer 120, it therefore has no layer interposed between the two.

More particularly, the PIN-type (or with an inverted emitter) structure comprises from the rear face to the front face (FIG. 2B) a multilayer stack forming:
- a first solar cell 110 with a silicon heterojunction based on amorphous silicon and crystalline silicon comprising from the rear face to the front face: a layer 115 of P-doped amorphous silicon ((p) a-Si:H), a first layer 113 of intrinsic amorphous silicon ((i) a-Si:H), a substrate 112 of N-type doped crystalline silicon (substrate c-Si (n)) and a second layer 114 of intrinsic amorphous silicon ((i) a-Si:H),
- a junction layer 120 made of TCO
- a second perovskite-type solar cell 130 comprising from the junction layer to the front face: a P-type layer 132, an active layer 131 made of a perovskite material, an N-type layer 133.

For this PIN-type structure, the second layer 114 of intrinsic amorphous silicon of the first cell 110 is directly in contact with the junction layer 120; it therefore has no layer interposed between the two.

In these different variants, the junction layer 120 made of TCO may have a thickness of 2 to 30 nm and preferably between 2 nm and 15 nm.

For example, the conductivity of the junction layer 120 made of TCO is higher than 10 S·cm$^{-1}$.

The junction layer 120 may be made of indium-tin oxide (ITO), zinc oxide (ZnO), aluminium-doped zinc oxide (AZO), indium-tungsten oxide (IWO), indium-zinc oxide (IZO), zirconium-doped indium oxide (IZrO) or tin dioxide ($SnO_{2-x}$ with $0<x<2$).

The band gap of the junction layer 120 made of TCO ranges from 2.8 to 4 eV.

The junction layer 120 made of ITO has a conduction band from −4.2 to −5.2 eV. For the other aforementioned doped oxides, the conduction band ranges from −4 to −5.2 eV.

Preferably, the junction layer 120 is made of ITO.

The silicon substrate 12 of the lower cell may be polished or textured (for example, it may consist of texturing in the form of 2 μm pyramids). The amorphous layers of the lower cell having a thickness of a few nanometres, they will take on the shape of the texturing of the substrate.

For example, the p/n type doping levels of the layers 111 and 115 are between $10^{18}$ and $10^{19}$/cm$^3$.

The N-type layer 133 of the second perovskite cell is called "electron transport layer" (or EIL standing for "Electron Injection Layer" or ETL standing for "Electron Transport Layer").

For example, the N-type layer 133 is a metal oxide such as zinc oxide (ZnO), aluminium-doped zinc oxide also called AZO (ZnO:Al), titanium oxide ($TiO_2$) or tin oxide ($SnO_2$). It may also consist of a stack of methyl [6,6]-phenyl-$C_{61}$-butanoate and of $SnO_2$ ($PCBM/SnO_2$) or of methyl [6,6]-phenyl-$C_{61}$-butanoate and of bathocuproine (PCBM/BCP).

The perovskite material of the active layer 131 of the second solar cell 130 has the general formula $ABX_3$ with A representing one or more monovalent organic cation(s), such as an ammonium, like methylammonium or formamidinium, or a monovalent metal cation, like cesium or rubidium; B representing a divalent metal cation like Pb, Sn, Ag or a mixture thereof; and X representing one or more halide anion(s).

More particularly, the perovskite material may have the particular formula $H_2NCHNH_2PbX_3$ or $CH_3NH_3PbX_3$ with X a halogen. For example, it may consist of methylammonium lead iodide $CH_3NH_3PbI_3$. Preferably, the perovskite material has the formula $Cs_xFA_{1-x}Pb(I_{1-y}Br_y)_3$.

The P-type layer 132 of the second cell 130 is also called "hole transport layer" (or HTL standing for "Hole Transport Layer").

For example, the P-type layer 132 is an organic compound like Poly(3,4-ethylenedioxythiophene) Polystyrene sulfonate (PEDOT:PSS), [poly(bis 4-phenyl}{2,4,6-trimethylphenyl}amine)] (PTAA), [Poly(N,N'-bis(4-butylphenyl)-N,N'-bis(phenyl)-benzidine] (Poly-TPD), 2,2', 7,7'-Tetrakis[N,N-di(4-methoxyphenyl)amino]-9,9'-spirobifluorene (spiro-OMeTAD), N4,N4'-bis(4-(6-((3-ethyloxetan-3-yl)methoxy)hexyl)phenyl)-N4,N4'-diphenyl-[1,1'-biphenyl]-4,4'-diamine (OTPD), poly[(9,9-dioctylfluorenyl-2,7-diyl)-co-(4,4'-(N-(4-sec-butylphenyl) diphenylamine)] (TFB) or pyrene, or else a metal oxide such as a molybdenum oxide, a vanadium oxide or a tungsten oxide. It could also be obtained from phosphate(s), silanes or carboxylic acids.

The tandem structure 100 may also comprise:
- a first electrode 140 (lower electrode) disposed at the rear face; the lower electrode 140 may, advantageously, be opaque or of limited transparency, for example a transparent conductive oxide such as in particular ITO, IOH (hydrogenated indium oxide), or AZO,
- a second electrode 150 (upper electrode) disposed over the front face of the device; the second electrode is electrically-conductive and optically-transparent, so as to let the photons pass up to the active layer 131 of the upper cell 130. This electrode 150 may be made of a transparent conductive oxide, typically indium-tin oxide (ITO) or aluminium-doped zinc oxide (ZnO:Al), or it may be formed of a transparent conductive polymer comprising silver nanowires for example,
- contact pads 160 at the rear face and contact pads 170 at the front face; the contact pads may for example be made of gold, aluminium or silver (deposited for example by evaporation, or printed by screen-printing, inkjet printing, etc.).

Illustrative and Non-Limiting Examples of One Embodiment

Optical simulations of different structures have been carried out using the CROWM software, while taking into account the optical indices of the layers, their thickness and the surface condition (completely flat, textured, etc.). These simulations are performed between 310 and 1,200 nm with the AM1.5 solar spectrum. The optical indices have been extracted by ellipsometry from the experimental layers.

Table 1 lists the thicknesses (nm) of the simulated layers for the NIP-type architectures.

|  | NIP reference structure | NIP simplified structure |
|---|---|---|
| ITO front face | 180 | 180 |
| PTAA | 30 | 30 |
| Perovskite | 250 and 415 | 250 and 415 |
| $SnO_2$ | 30 | — |
| Junction layer made of rec. ITO | 12 | 12 |
| a-Si:H (p) | 19 | 19 |
| a-Si:H (i) | 5 | 5 |
| c-Si | 280000 | 280000 |
| a-Si:H (i) | 5 | 5 |
| a-Si:H (n) | 8 | 8 |
| ITO rear face | 70 | 70 |
| Ag | 200 | 200 |

Table 2 lists the thicknesses (nm) of the simulated layers for the PIN-type architectures.

|  | NIP reference structure | NIP simplified structure |
|---|---|---|
| ITO front face | 180 | 180 |
| $SnO_2$ | 30 | 30 |
| Active layer made of perovskite | 250 and 415 | 250 and 415 |
| PTAA | 30 | 30 |
| Junction layer made of rec. ITO | 12 | 12 |
| a-Si:H (n) | 8 | — |
| a-Si:H (i) | 5 | 5 |
| c-Si | 280000 | 280000 |
| a-Si:H (i) | 5 | 5 |
| a-Si:H (p) | 19 | 19 |
| ITO rear face | 70 | 70 |
| Ag | 200 | 200 |

The perovskite used in the simulations is of the $Cs_xFA_{1-x}Pb(I_{1-y}Br_y)_3$ type (with x<0.20; 0<y<1), two different thicknesses have been used to obtain less current discrepancy between the two sub-cells when the surface condition is modified.

Figure 3A:
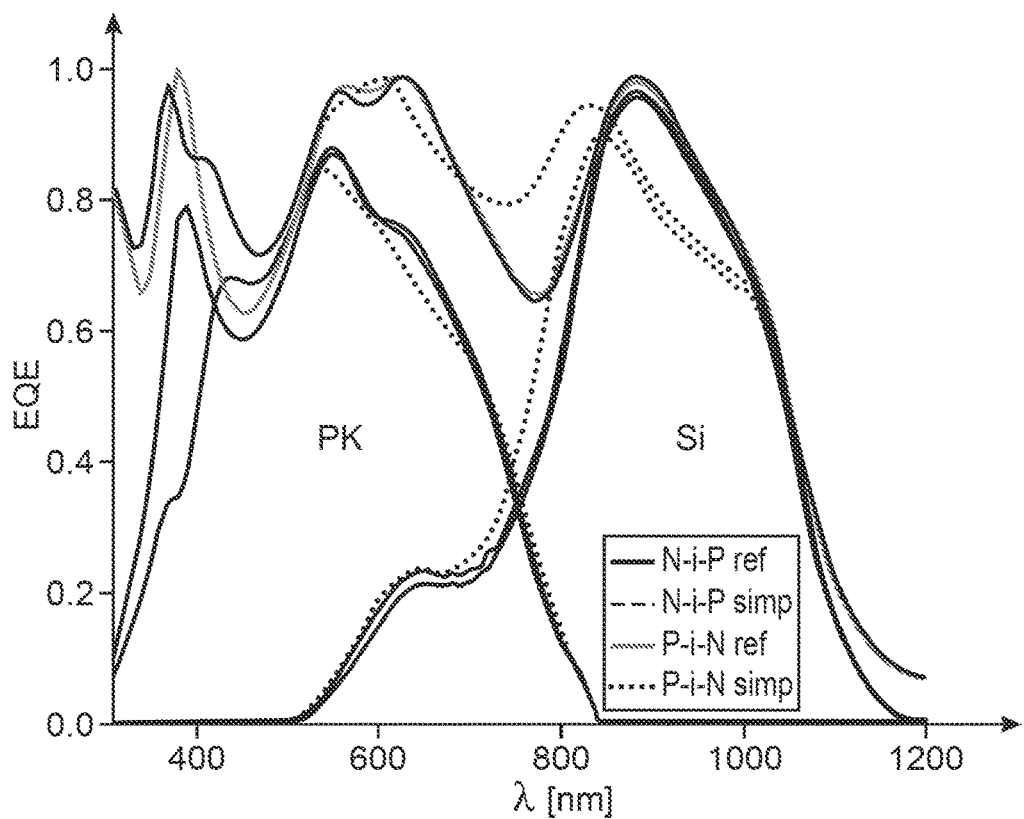
FIGS. 3A, 3B and 3C are graphs representing the EQE and the '1-Rtot' value as a function of the wavelength (with Rtot corresponding to the total reflection of the stack of the cell (without the metallisation at the front face), obtained by optical simulation for tandem structures with a PIN or NIP type thin (12 nm) junction made of ITO, and having, respectively either two polished faces, or one textured rear face or both faces textured; 'ref' corresponds to conventional tandem structures and 'simp' to simplified tandem structures, according to particular embodiments of the invention; the simplified tandem structures differ from the conventional structures by the absence of a layer with a N polarity in one of the sub-cells.
Figure 3B:
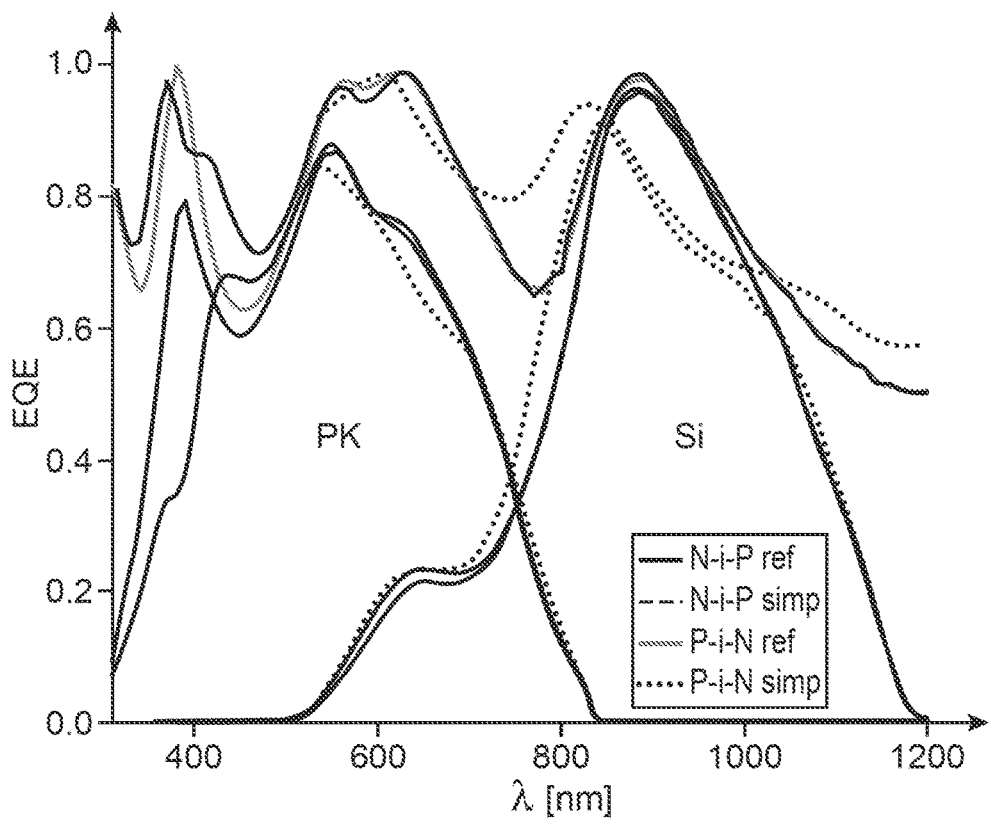
Figure 3C:
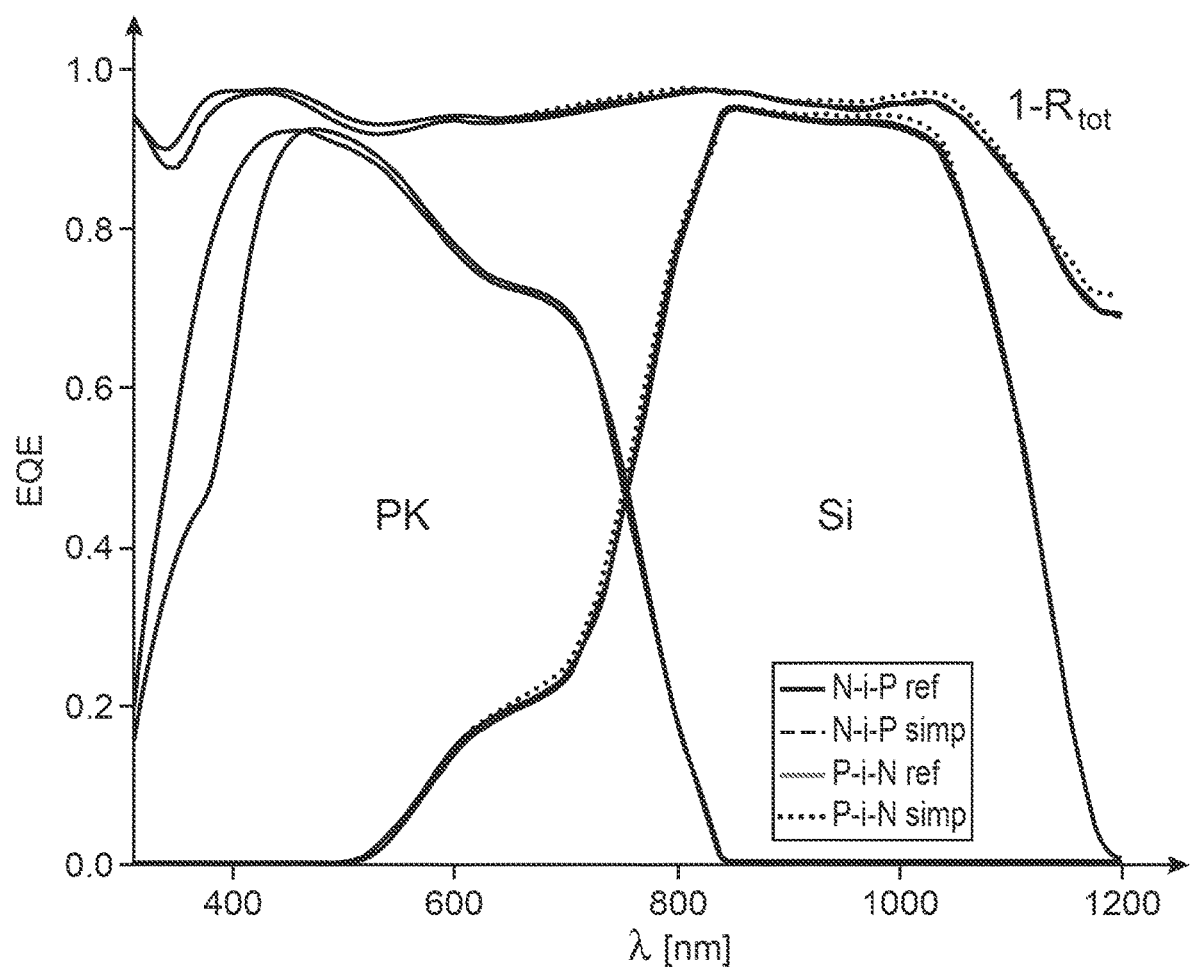

FIGS. 3A, 3B and 3C represent the EQE and 1-Rtot values obtained by optical simulations for the different tandem structures of Tables 1 and 2.

The disclosed results correspond to tandem structures wherein the active layer of the upper cell is a perovskite material that is 250 nm thick when the front face is polished and 415 nm thick when it is textured.

This optical simulation study demonstrates that simplified NIP and PIN tandem structures with a junction made of ITO are viable regardless of texturing. Indeed, these simplified structures have only very few differences from an optical perspective with conventional complete structures and have the same optical potential.

In addition, the following Table 3 lists the values of $J_{sc}$ and $R_{tot}$ obtained by optical simulations, the estimated PCEs for FF=75% and $V_{oc}$=1.8 V. This table shows that the resulting short-circuit currents are quite similar.

| Front face | Rear face | NIP/PIN | FIG. | $J_{sc}$ PK (mA/cm$^2$) | $J_{sc}$ Si (mA/cm$^2$) | PCE (%) | $R_{tot}$ (mA/cm$^2$) |
|---|---|---|---|---|---|---|---|
| Reference tandem structure | | | | | | | |
| polished | textured | NIP | 1A | 16.95 | 16.58 | 22.38 | 9.2 |
| polished | textured | PIN | 1B | 16.93 | 16.79 | 22.67 | 9.69 |
| polished | polished | NIP | 1A | 16.95 | 15.79 | 21.32 | 11.41 |
| polished | polished | PIN | 1B | 16.93 | 16.09 | 21.72 | 11.83 |
| textured | textured | NIP | 1A | 19.67 | 20 | 26.55 | 2.9 |
| textured | textured | PIN | 1B | 19.99 | 20.1 | 26.99 | 3.06 |
| Simplified tandem structure | | | | | | | |
| polished | textured | NIP | 2A | 16.58 | 17.16 | 22.38 | 8.73 |
| polished | textured | PIN | 2B | 16.91 | 16.88 | 22.79 | 9.67 |
| polished | polished | NIP | 2A | 16.58 | 16.36 | 22.09 | 11.18 |
| polished | polished | PIN | 2B | 16.91 | 16.13 | 21.78 | 11.85 |
| textured | textured | NIP | 2A | 19.42 | 20.32 | 26.22 | 2.69 |
| textured | textured | PIN | 2B | 19.99 | 20.12 | 26.99 | 3.05 |

What is claimed is:

1. A 2-terminal PIN-type tandem photovoltaic structure comprising, from the rear face to the front face:
   a first solar cell with a silicon heterojunction comprising a first P-type layer made of doped amorphous silicon and a substrate of N-type doped crystalline silicon disposed between a first layer of intrinsic amorphous silicon and a second layer of intrinsic amorphous silicon,
   a junction layer,
   a second perovskite-type cell comprising a second P-type layer, an active layer made of a perovskite material and an N-type layer,
   wherein the junction layer is made of a transparent conductive oxide,
   and wherein the junction layer is in direct physical contact with the second layer of intrinsic amorphous silicon of the first solar cell and with the second P-type layer of the second solar cell,
   the junction layer serving as an N-type layer in the first solar cell.

2. The tandem structure according to claim 1, wherein the junction layer is made of ITO.

3. The tandem structure according to claim 1, wherein the junction layer is made of AZO, ZnO, IWO, IZO, IZrO or $SnO_{2-x}$ with x greater than 0 and strictly less than 2.

4. The tandem structure according to claim 1, wherein the junction layer has a thickness from 2 to 30 nm and preferably between 2 nm and 15 nm.

5. The tandem structure according to claim 1, wherein the junction layer has a conductivity higher than $10\ S \cdot cm^{-1}$.

6. The tandem structure according to claim 1, wherein the tandem structure comprises from the rear face to the front face:
   the first solar cell with the silicon heterojunction based on amorphous silicon and crystalline silicon comprising, from the rear face to the front face: the first P-type layer made of doped amorphous silicon, the first layer of intrinsic amorphous silicon, the substrate of N-doped crystalline silicon and the second layer of intrinsic amorphous silicon,
   the junction layer made of N-type TCO,
   the second perovskite-type solar cell comprising, from the junction material to the front face: the second P-type layer, made of PTAA or TFB, the active layer made of a perovskite material and the N-type layer made of $SnO_2$ or formed by a $PCBM/SnO_2$ bilayer.

7. The tandem structure according to claim 1, wherein the perovskite material has the formula $Cs_xFA_{1-x}Pb(I_{1-y}Br_y)_3$ (with x<0.20; 0<y<1).

* * * * *